United States Patent [19]
Ethe et al.

[11] Patent Number: 4,629,908
[45] Date of Patent: Dec. 16, 1986

[54] MOS MONOSTABLE MULTIVIBRATOR

[75] Inventors: Ronald S. Ethe, Commack; Steven Burstein, Smithtown, both of N.Y.

[73] Assignee: Standard Microsystems Corp., Hauppauge, N.Y.

[21] Appl. No.: 702,480

[22] Filed: Feb. 19, 1985

[51] Int. Cl.$^4$ ............................................. H03K 3/355
[52] U.S. Cl. ................................... 307/273; 307/443; 307/481; 307/568; 307/594
[58] Field of Search .................... 307/200 B, 443, 481, 307/362, 363, 542, 544, 550, 551, 553, 565, 568, 572, 584, 264, 273, 591, 594, 601, 605

[56] References Cited

U.S. PATENT DOCUMENTS

| | | | |
|---|---|---|---|
| 3,725,792 | 4/1973 | Kellogg | 307/443 X |
| 3,996,482 | 12/1976 | Lockwood | 307/273 |
| 4,321,484 | 3/1982 | Blaser | 307/273 |
| 4,525,640 | 6/1985 | Boyle et al. | 307/584 X |
| 4,547,684 | 10/1985 | Pechar | 307/582 X |
| 4,580,065 | 4/1986 | Haque | 307/273 |

OTHER PUBLICATIONS

Salomon, "FET Multiplies Pulse Time of IC One-Shot", Electronics, Apr. 1971, vol. 44, No. 8, p. 90.
Hagaraj et al, "Multistage Monostable Multivibrator Using Load-Coupled Regenerative Feedback", Electronics Letters, vol. 17, No. 4, 2-1981, pp. 159-160.

Primary Examiner—Larry N. Anagnos
Assistant Examiner—N. R. Hudspeth
Attorney, Agent, or Firm—Hopgood, Calimafde, Kalil, Blaustein & Judlowe

[57] ABSTRACT

A monostable multivibrator includes a pair of MOSFETS (34, 42) electrically coupled to an input node (12) and a MOS logic gate which has one input coupled to this node and another input adapted to receive a delayed signal from another node (38). The MOSFETS are configured to hold node 38 at ground and keep the input MOSFET of the logic gate electrically isolated from the means used to generate the delayed signal thereby enabling the output MOSFET of the logic gate to charge its output efficiently with respect to time.

12 Claims, 8 Drawing Figures

MOS MONOSTABLE MULTIVIBRATOR

TECHNICAL FIELD

This invention relates to MOS monostable multivibrators for use in digital systems and the like, and is more particularly directed to improving the characteristics thereof by selectively coupling capacitive nodes associated with a logic gate to ground or other reference potential.

BACKGROUND OF THE INVENTION

Monostable multivibrators, sometimes known as one-shot multivibrators, are well known to those skilled in the art. One way of constructing a monostable multivibrator for use in digital systems includes utilizing an inverter and a NOR gate. One of the inputs of the NOR gate is connected to the output of the inverter, while the other input remains available to directly receive an incoming signal. The input of the inverter and the available input of the NOR gate are electrically connected to the same node.

A digital signal incident on the node will thus be applied to both an input of the inverter and an input of the NOR gate. As the signal is operated on by the inverter, the output thereof will be slightly delayed with respect to the original input signal. The output of the inverter is then received by the input of the NOR gate. Assuming that the node is ordinarily held at a logic low, a logic high input pulse of arbitrary length will cause the system described above to produce a logic high pulse of predetermined length at the output of the NOR gate. The duration of this pulse will be roughly equal to the time of the delay caused by the inverter. Any odd number of inverters may be used to increase the length of the delay, and/or capacitors may be connected to the outputs of some or all of the nodes to increase the delay.

While devices constructed in accordance with the foregoing are suitable in many conventional systems, shortcomings often become apparent, especially in high-speed or low-power applications.

During the delay created by the inverter, the voltage at the output of the inverter is gradually increasing in magnitude and in response to this voltage, the input MOSFET of the NOR gate begins to conduct current. This current path draws current from the output MOSFET of the NOR gate, reducing the efficiency of the output MOSFET as it charges its output node. Hence, the conventional monostable multivibrator has a gradually sloping output voltage waveform which is unable to efficiently optimize the voltage amplitude at the output of the multivibrator with respect to time. In other words, the system consumes unnecessary power between switching states due to resistive dissipation of energy because of current flow. Moreover, the resulting waveform at the output of the NOR gate lacks a sharp, distinct edge.

It is accordingly an object of the invention to provide a way to isolate the input MOSFET of a MOS logical device from voltage transients so that it can efficiently charge its output.

Another object of the invention is to provide means to quickly force a node to a given potential to reduce current flow and produce an output signal with well defined edges.

Yet another object of the invention is to provide a device which can provide a delayed signal synchronized to an input signal in a simplified construction.

These and other objects of the invention will become clear from the disclosure which follows.

SUMMARY OF INVENTION

The present invention remedies the shortcomings of the prior art in providing a monostable multivibrator with a sharp output waveform. This is accomplished in accordance with the invention by providing a MOS NOR gate with a pulse and a delayed signal synchronized thereto. One output of the NOR gate is adapted to receive the input directly, while the other is switchedly coupled to an inverted and delayed version thereof.

More specifically, a device constructed according to the present invention has a first node adapted to receive an incoming pulse with an input of a NOR gate connected thereto. The incoming pulse also communicates with a delay circuit which produces a delayed and inverted version of the pulse at a second node. Another input of the NOR gate is also connected to the second node.

Between the second node and the delay circuit there is provided a switching element which prevents current flow from the delay circuit to the NOR gate during the delay period. The invention may be further refined by adding a second switching element at the second node to hold it near the ground reference potential of the system.

Without an applied voltage, the input MOSFET of the NOR gate will not conduct current during the delay period, which in turn allows the output MOSFET of the NOR gate to charge its output more quickly than would be the case if the input node were conducting current.

BRIEF DESCRIPTION OF DRAWINGS

Several ways of carrying out the invention are described in detail below with reference to the drawings wherein like numerals designate similar parts and which illustrate only specific embodiments. In the drawings.

DETAILED DESCRIPTION

By way of example only, the following logic system specifications will provide a clearer understanding of the detailed description of the inventive monostable multivibrator which follows. It is understood that using other system specifications and components would be apparent to those of ordinary skill in the art. The supply voltage of the logic system is about five volts in preferred embodiments with roughly 1.5 to 4 volts needed to indicate a logic high, depending on the parameters of the various components. The system is grounded at zero volts with respect to the supply voltage and a logic low threshold may be in the range of about 0.2 to about 0.6 volts, again depending upon system parameters of the particular construction employed. The n-channel enhancement-mode MOSFETs used in connection with the embodiments of the following description require a gate source voltage of about 0.5 to 1.2 volts to become conductive.

Figure 1:
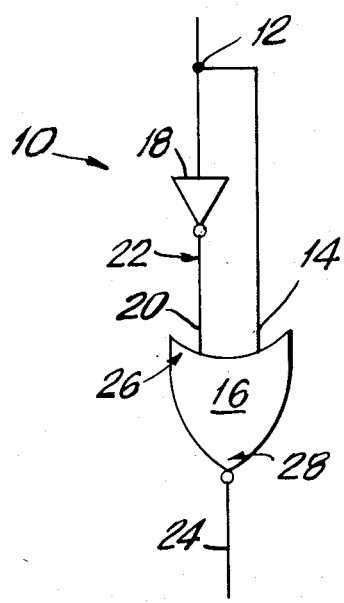
FIG. 1 is a block diagram of a known MOS monostable multivibrator.

Referring now specifically to the drawings, FIG. 1 shows a conventional monostable multivibrator 10, as will be recognized by those of ordinary skill in the art. Multivibrator 10 consists of an input node 12 connected to one input 14 of a NOR gate 16 and an inverter 18 connected to node 12, its output being connected to another input 20 of NOR gate 16.

Figure 2:
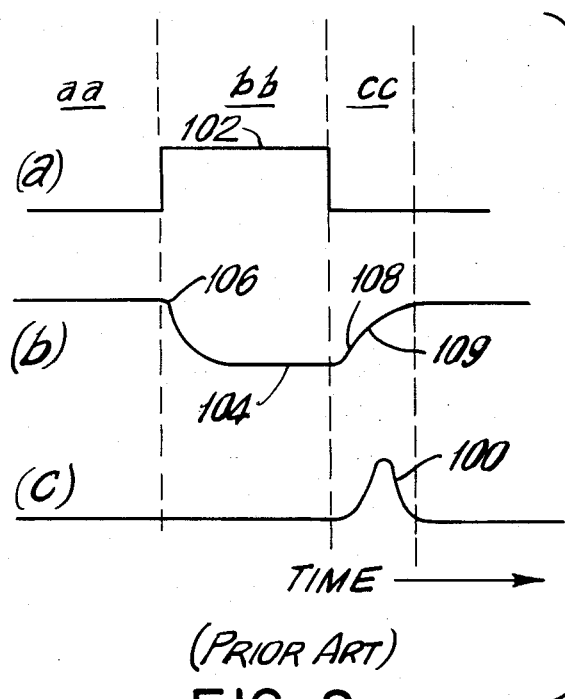
FIG. 2 is a schematic diagram of waveforms useful in explaining the device of FIG. 1.

The operation of multivibrator 10 is most clearly described by reference to FIG. 2. In the state at time aa of the multivibrator the input to mode 12 is held at a logic low as shown in FIG. 2(a) at the left. The output of inverter 18 generally indicated at 22 in FIG. 1 is thus held at a logic high as shown in FIG. 2(b). Therefore, input 20 is held at a logic high, while input 14 of NOR gate 16 is held at a logic low. The output of NOR gate 16, generally indicated at 24, will be at a logic low as a result of the aforementioned inputs. This is so because a NOR gate, such as MOS NOR gate 16, has the following truth table:

| NOR Gate Truth Table | | |
|---|---|---|
| Input 1 | Input 2 | Output |
| 0 | 0 | 1 |
| 0 | 1 | 0 |
| 1 | 0 | 0 |
| 1 | 1 | 0 |

Output 24 is only at a logic high when both inputs 20 and 14 are at logic now. This property can be used to generate a pulse 100 of predetermined duration from an input pulse 102 of arbitrary duration with the device of FIG. 1.

During a period bb when a logic high pulse 102 is incident on node 12, output 22 of inverter 18 will assume a logic low as shown at 104 in FIG. 2(b). It should be noted that there is a delay (shown at 106) before output 22 goes low. Similarly, there is a delay, shown at 108, before the inverter goes high after pulse 102 has passed. These delays are a property of typical inverters and a capacitor may be connected from the output of the inverter to a reference voltage in order to increase the delay.

Delay 108 causes gate 16 to emit pulse 100 during the period cc, in other words, at the trailing edge of pulse 102. This is so because as pulse 102 passes through the system, node 12 and hence input 14 almost immediately assume a logic low, while output 22 of inverter 18 and hence input 22 remain at a logic low during the delay interval 108. Both inputs being low, the NOR gate will output a logic high pulse 100 with a duration corresponding to the delay period in accordance with the truth table set forth hereinabove.

During the delay period caused by the inverter, specifically at 108, the voltage at output 22 of inverter 18 is gradually increasing, as shown at 109. This causes the input MOSFET generally designated at 26, at input 20 of NOR gate 16 to conduct current. This current path draws current from the output MOSFET, generally designated at 28, reducing its efficiency as it charges the output node at 24. Thus, this monostable multivibrator has a gradually sloping output voltage waveform 100 that is not efficient at optimizing the amplitude of the voltage at output 24 with respect to time.

Figure 3:
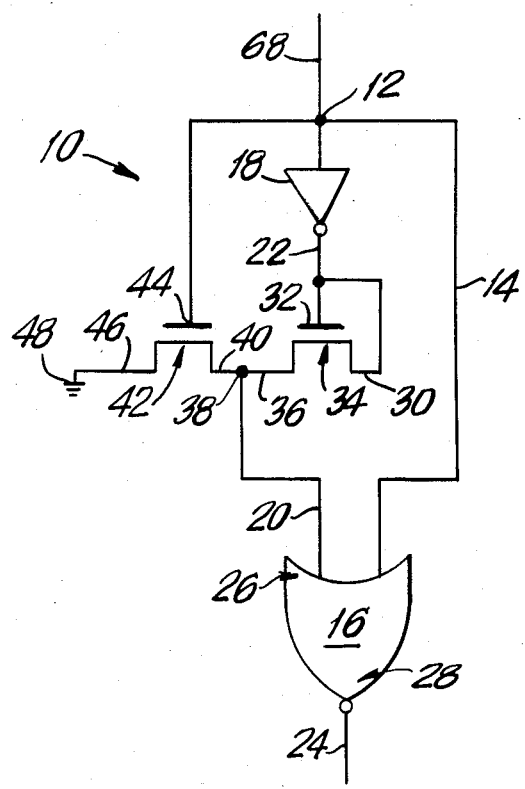
FIG. 3 is a block diagram of a monostable multivibrator constructed in accordance with the instant invention.

The invention solves this problem by including a pair of n-channel enhancement-mode MOSFETS in a switching arrangement as shown in FIG. 3.

Connected to output 22 of inverter 18 is the drain 30 and the gate 32 of a first n-channel enhancement-mode MOSFET 34. The source terminal 36 of transister 34 is connected to a node 38 which in turn is connected to the drain 40 of another n-channel enhancement-mode MOSFET 42. The gate 44 of MOSFET 42 is connected to node 12, while the source 46 is grounded at 48. Node 38 is connected to input 20 of NOR gate 16.

The logical states of multivibrator 10 of FIG. 3 are most clearly described with reference to FIG. 4. In one state, at time aa, a logical low is supplied to input node 12. Output 22 of inverter 18 is correspondingly held at a logical high. That is to say, the output at 22 is logically inverted with respect to the input at 12 and 14.

The logic high voltage at 22 is several transister thresholds above the system logic low and this voltage is supplied to gate 32 and drain 30 of MOSFET 34. If the voltage at 38 is a threshold or more below this voltage, then transistor 34 is in a conductive state and a logic high is applied to node 38 and hence to input 20 of NOR gate 16. This holds output 24 of NOR gate 16 low, in accordance with the characteristics of gate 16, as described hereinabove.

Without a logic high pulse to node 12, gate 44 of MOSFET 42 is generally at substantially the same potential as the ground at 48. Thus there is an open circuit between node 38 and ground 48.

When node 12 is supplied with a logic high pulse (102 FIG. 4) output 22 and, as will be seen, node 38 will go to logic low 104 after a short delay. The output of the inverter will assume the logic low as quickly as the device and the capacitance associated with output 22 will allow.

As the logic high arrives at node 12, it is applied to gate 44 of transister 42, which renders the transistor conductive. Node 38 is thus grounded. After a short delay, when output 22 goes low, there is insufficient gate-source voltage to maintain transistor 34 in a conductive state, so it switches off.

Figure 4:
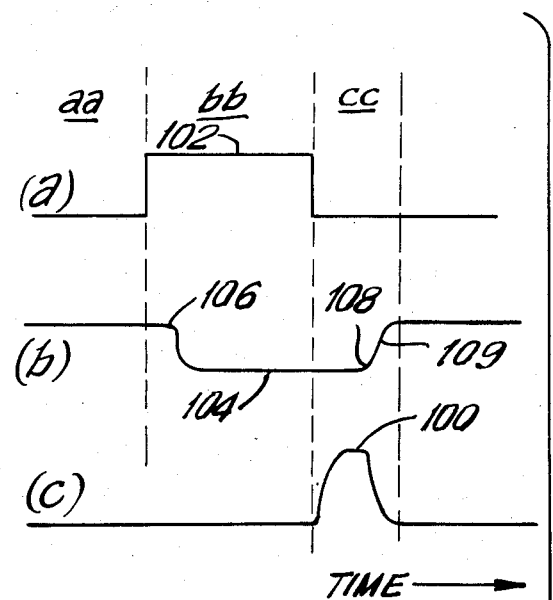
FIG. 4 is a schematic diagram of waveforms useful in explaining the operation of the device of FIG. 3.

In this manner, node 38 becomes electrically isolated from output 22 during the time period indicated as bb in FIG. 4, while node 38, input 20 and MOSFET 26 of gate 16 are grounded as we turn to the next time period cc in FIG. 4.

After pulse 102 has passed, the voltage at 22 will start to gradually increase. However, MOSFET 34 will not conduct current until the voltage at gate 32 is at least one threshold higher than the voltage at node 38. The time delay before MOSFET 34 conducts will be determined by the output impedance of inverter 18 and the capacitance associated therewith. During this delay, the voltage at node 38 will remain substantially near the ground reference potential as shown at 104 in FIG. 4, it being noted that MOSFET 42 has been switched off.

With node 38 at ground during a major portion of the delay period cc, MOSFET 26 of NOR gate 16 will not conduct current. This allows output MOSFET 28 of the NOR gate to charge output 24 to a voltage of desirable amplitude more quickly than would be possible if MOSFET 26 were drawing current from a related current path, as is the case with prior art monostable multivibrators. In this way, the crisp waveform with distinct edges of FIG. 4(c) is achieved.

It should be noted that as the voltage at 22 becomes at least one threshold greater than the voltage at 38, MOSFET 34 is switched on and multivibrator 10 again outputs a logic low. Various modifications of the above noted invention include using any odd number of inverters instead of single inverter 18 in order to increase the delay period.

Figure 5:
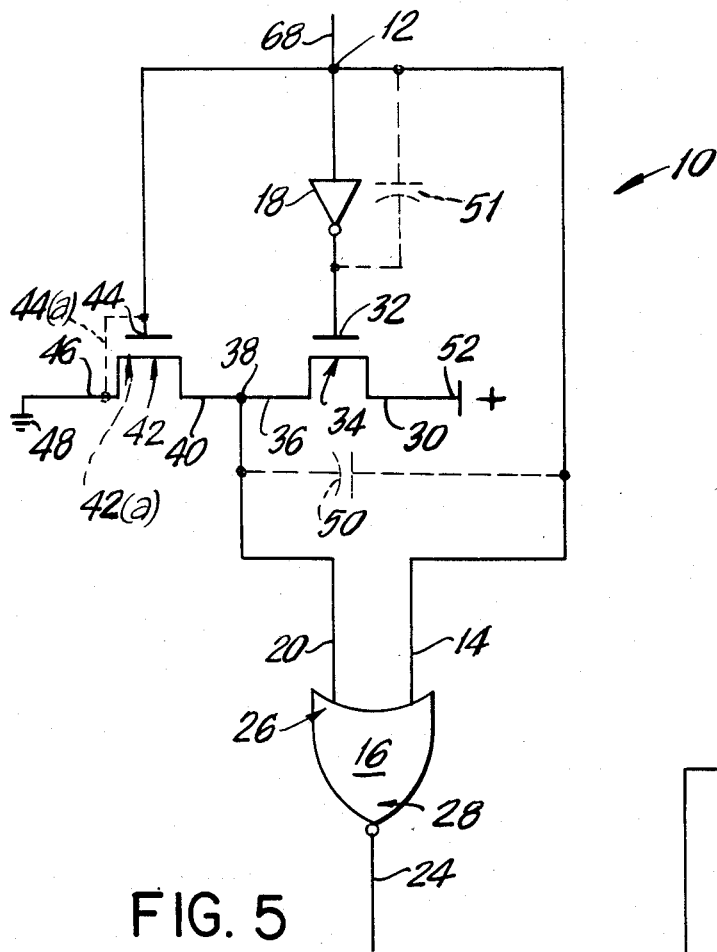
FIG. 5 is a block diagram of an alternative construction of a monostable multivibrator in accordance with the instant invention.

Alternatively, a capacitor 50 could be connected from input node 12 to node 38 as shown in FIG. 5 as a method of increasing the delay period, it being understood that other capacitors could be added to increase the capacitance at the various nodes if so desired. For example, a capacitor 51 can be used to couple output 22 to input 12. The embodiment shown in FIG. 5 is a modification of the one shown in FIG. 3. the discussion of which is incorporated here by reference.

In FIG. 5, Drain 30 of n-channel enhancement-mode transistor 34 is connected to a voltage source 52 instead of output 22 of inverter 18. The voltage at 52 may be the supply voltage of the system. The configuration of MOSFETS 34 and 42 in FIG. 5 may be termed a push-pull buffer arrangement.

With a low input at 12, output 22 has a positive voltage which renders MOSFET 34 conductive, making the voltage at 38 correspond to the voltage at 52 less the threshold voltage of MOSFET 34. The low input at 12 switches off MOSFET 42 so that node 38 is not grounded. Thus, gate 16 has a positive input at 20 so that its output is zero.

When a logic high pulse arrives at node 12, inverter 22 goes low, switching off MOSFET 34 after a short delay. Simultaneously, MOSFET 42 is switched on so that node 38 is grounded. After the pulse passes, when node 12 goes to zero volts, there is a time delay before the rising voltage at 22 switches MOSFET 34 on. Thus, there is a delay period when both inputs of gate 16 are at zero, so that a pulse of predetermined duration is generated. The time delay is longer when a capacitor 50 is connected between node 12 and 38 than would be the case without a capacitor, because the voltage across the capacitor cannot change instantaneously.

As the discussion hereinabove makes clear, there are a variety of ways to configure a monostable multivibrator in accordance with the instant invention. The delay period will depend upon the collective parameters of the various components. It is also possible to generate the delay using different arrangements as discussed in more detail below.

Figure 6:
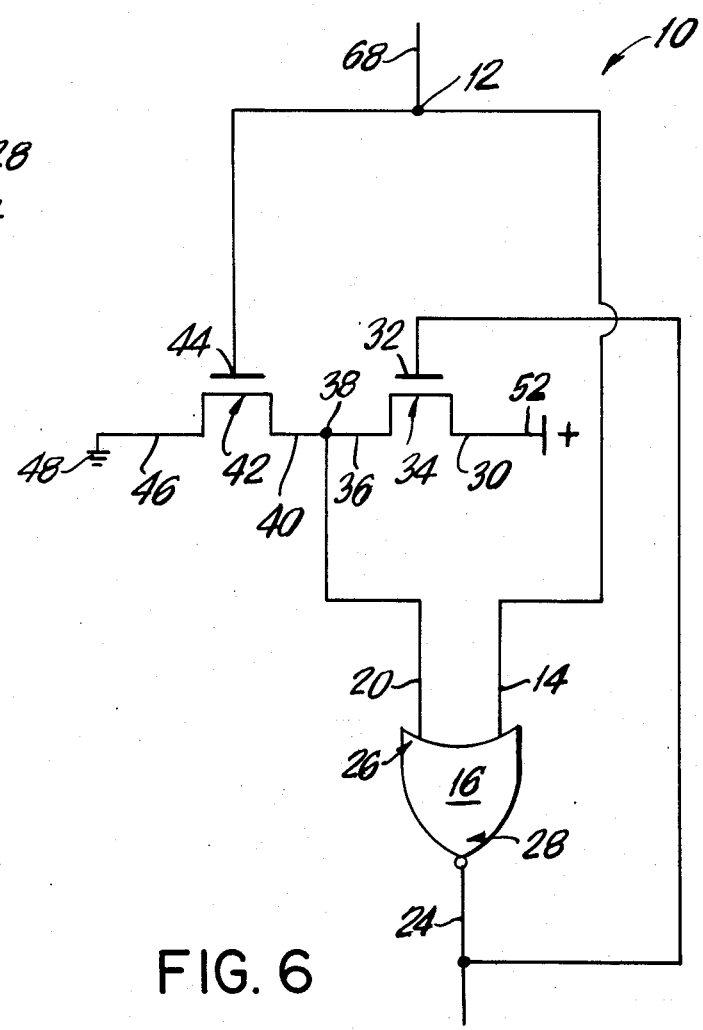
FIG. 6 is a block diagram of a second alternative construction of a monostable multivibrator in accordance with the instant invention.

FIG. 6 shows an embodiment of the instant invention which has dynamic monostable states provided the parameters of the system are chosen properly. In particular, input pulses 102 are of high enough frequency so that node 38 remains charged at a logic high between pulses so that output 24 remains low.

In FIG. 6, input 14 of MOS NOR gate 16 is connected to node 12. Input 20 of NOR gate 16 is connected to node 38; however, with the gate of MOSFET 34 connected to the output 24 of NOR gate 16 there is no need for an inverter. With an input low at 12, input 14 of gate 16 remains low.

As a logic high signal is received by node 12, input 14 of NOR gate 16 almost immediately becomes high. After a short delay, node 38 is grounded by MOSFET 42. When the pulse passes, MOSFET 42 is switched off and both input 14 and 20 are low so that NOR gate 16 goes high at output 24. This high in turn causes MOSFET 34 to switch on so that node 38 is exposed to supply voltage 52, roughly five volts. The voltage at 38 thus created causes output 24 to go low.

The delay between the time the pulse passes and the time node 38 goes high will be the length of the pulse 100 at 24.

When output 24 goes low, MOSFET 34 is switched off, the capacitance at node 38 remains charged to a logic "one" level, having no current path through which to discharge and output 24 will remain low until the next high arrives at node 12.

Figure 7:
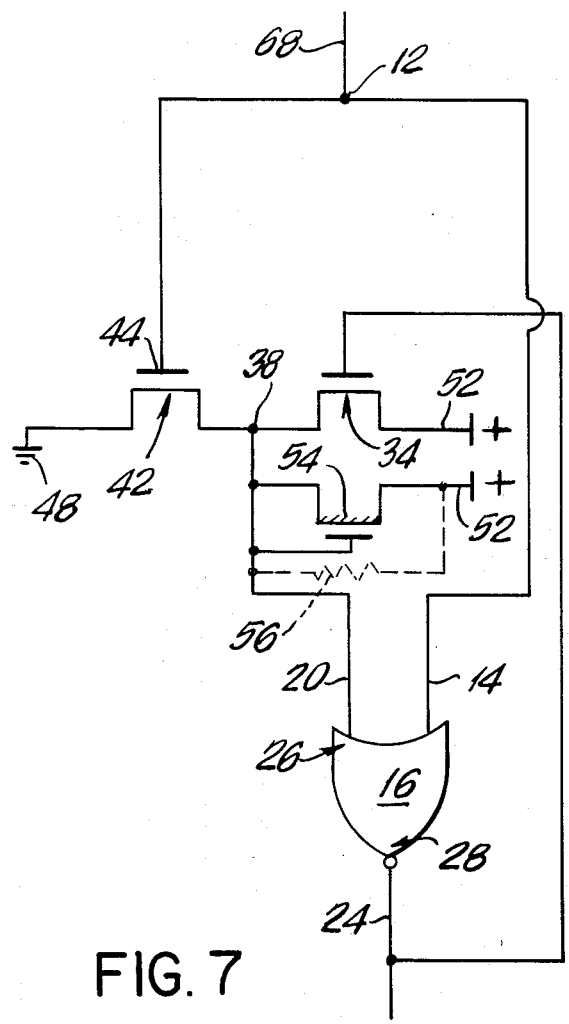
FIG. 7 is a block diagram of a third alternative construction of a monostable multivibrator in accordance with the instant invention.

FIG. 7 shows the embodiment of FIG. 6 where an n-channel depletion node MOSFET 54 has been added from node 38 to supply 52. MOSFET 54 provides current to keep node 38 charged between pulses 102 of the input, removing the minimum frequency requirement on the input pulse stream. Other pull-up means, such as a resistor 56 could be used for the same purpose.

Figure 8:
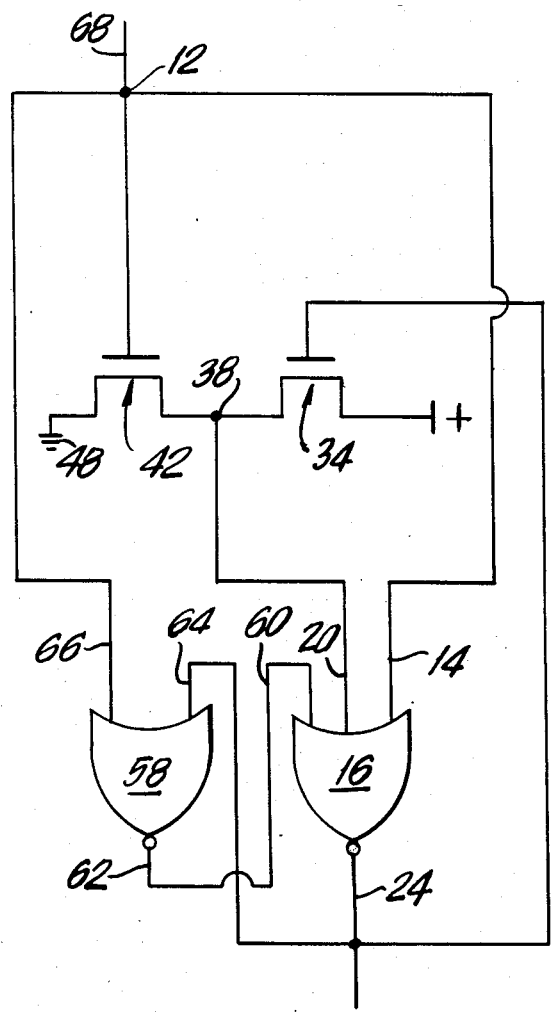
FIG. 8 is a block diagram of a fourth alterative construction of a monostable multivibrator in accordance with the instant invention.

Yet another embodiment of the instant invention is shown in FIG. 8, where NOR gate 16 is a three input NOR gate cross coupled to another MOS NOR gate 58, it being understood that other storage elements would be suitable inasmuch as NOR gate 58 and NOR gate 16 thus connected are a cross coupled NOR latch, similar to a set-reset flip-flop.

As in FIG. 6, input 14 of MOS NOR gate 6 is connected to node 12. Input 20 of NOR gate 16 is connected to node 38. There is in addition a third input 60 to NOR gate 16 which is connected to output 62 of NOR gate 58; inputs 64 and 66 are connected to output 24 and node 12 respectively. As discussed in connection with FIG. 6, node 38 and input 20 are high after pulse 102 has passed. This condition forces output 24 low, it being noted that input 66 is also low. With both inputs 66 and 64 low, the output 62 of MOS NOR gate 58 is high and so is input 60 of three input NOR gate 16. This state is remembered so that it does not matter if node 38 remains sufficiently charged between pulses.

In various embodiments discussed hereinabove, the voltage at the input of the NOR gate remains substantially near the ground reference potential during the delay period so that the input MOSFET of the NOR gate does not conduct current. This in turn allows the output MOSFET of the NOR gate to charge its output to a desirable amplitude more quickly than would be possible if the input MOSFET were to conduct current. Another way to ground node 38 is to substitute an n-channel depletion mode MOSFET 42(a) for MOSFET 42. The drain of MOSFET 42(a) is connected to node 38 and both its gate and source are connected to ground as shown at 44(a) in FIG. 5. In this manner, node 38 will be passively grounded during the delay period between pulses. It should be noted of course that in this alternate embodiment the gate of MOSFET 44(a) is not connected to input 12.

Although several examples of the inventive monostable multivibrator have been described in detail hereinabove, various modifications will be obvious to those of ordinary skill in the art. For example, an inverter could be added to node 12 at 68 in any of FIGS. 3, 5, 6, 7, or 8 to change the inventive monostable multivibrator to a leading-edge, rather than a trailing-edge triggered device. Alternatively, logical means other than a NOR gate may be used to generate a pulse from a pair of logically inverted and out of phase signals. Other equivalent logic circuits can be demonstrated by Boolean Algebra, as is readily apparent to those skilled in the art. Such modifications are within the spirit and scope of the present invention, which is limited and defined only by the appended claims.

What is claimed is:

1. A monostable multivibrator for outputting a pulse of predetermined duration in response to an input pulse of arbitrary duration comprising:
   a. a single logic gate having first and second inputs, said first input being connected to said system to receive said input pulse of arbitrary duration;
   b. delay means for supplying a signal to said second input of said logic gate, said signal being delayed with respect to said input pulse and logically inverted with respect thereto, said logic gate outputting a pulse of predetermined duration in response to said input pulse and said signal; and
   c. an enhancement mode MOSFET electrically connected to the output of said delay means for electrically isolating said delay means from said second input during a substantial portion of the delay period between said input pulse and said delayed signal and electrically coupling and delay means to said second input of said logic gate after the delay period is substantially ended.

2. The monostable multivibrator according to claim 1, wherein the gate and drain of said enhancement mode MOSFET are electrically connected to said output of said delay means and the source of said enhancement mode MOSFET is electrically connected to said second input of said logic gate.

3. The monostable multivibrator according to claim 1, wherein the drain of said enhancement mode MOSFET is electrically connected to a reference voltage and the gate of said enhancement mode MOSFET is electrically connected to said output of said delay means and the source of said enhancement mode MOSFET is electrically connected to said second input of said logic gate.

4. The monostable multivibrator according to claim 1, further comprising a second MOSFET electrically connected to said second input of said logic gate and a reference potential for forcing said second input to substantially the same potential as said reference potential in one of said switching states of said second MOSFET.

5. The monostable multivibrator according to claim 4, wherein said reference potential is the ground reference potential of said electrical system.

6. The monostable moltivibrator according to claim 4, wherein said second MOSFET is an enhancement mode MOSFET, the drain of which is electrically connected to said second input of said logic gate, the gate of which is electrically connected to said first input of said logic gate and the source of which is electrically connected to said reference potential.

7. The monostable multivibrator according to claim 4, wherein said second MOSFET is a depletion mode MOSFET, the drain of which is electrically connected to said second input of said logic gate and the gate and source of which are electrically connected to said reference potential.

8. The monostable multivibrator according to claim 6, wherein said first and second enhancement mode MOSFETs are n-channel enhancement mode MOSFETs.

9. The monostable multivibrator according to claim 7, wherein said first and second MOSFETs are n-channel MOSFETs.

10. The monostable multivibrator according to claim 1, wherein said logic gate is a NOR gate.

11. The monostable multivibrator according to claim 1, wherein the drain of said enhancement mode MOSFET is electrically connected to a reference voltage and the gate of said enhancement mode MOSFET is electrically connected to the output node of said logic gate and the source of said enhancement mode MOSFET is electrically connected to said second input of said logic gate.

12. The monostable multivibrator according to claim 11, further comprising a depletion mode MOSFET, the gate and source of which are electrically connected to said second input and the drain of which is connected to a reference voltage.

* * * * *